United States Patent [19]

Teymouri

[11] Patent Number: 5,113,098
[45] Date of Patent: May 12, 1992

[54] GLITCH REMOVER CIRCUIT FOR TRANSMISSION LINKS

[75] Inventor: Sassan Teymouri, Sunnyvale, Calif.

[73] Assignee: Advanced Micro Devices, Inc., Sunnyvale, Calif.

[21] Appl. No.: 677,550

[22] Filed: Mar. 29, 1991

[51] Int. Cl.[5] .......................... H03B 1/00; H03K 5/00
[52] U.S. Cl. .................................. 307/520; 307/521; 307/556; 328/167
[58] Field of Search ............... 307/520, 521, 234, 566, 307/443; 328/164, 167, 111

[56] References Cited

U.S. PATENT DOCUMENTS

| | | | |
|---|---|---|---|
| 3,391,389 | 7/1968 | Cruger et al. | 307/520 |
| 4,322,641 | 3/1982 | Packard | 307/521 |
| 4,353,032 | 10/1982 | Taylor | 307/520 |

FOREIGN PATENT DOCUMENTS 62-178010  8/1987  Japan .................................. 307/520

Primary Examiner—Eugene R. Laroche
Assistant Examiner—Tan Dinh
Attorney, Agent, or Firm—Davis Chin

[57] ABSTRACT

Glitch remover circuit for removing glitches and spikes from control signals received on a SCSI bus line that is coupled from a transmission line includes an input buffer circuit (12) and a filter circuit (14). The input buffer circuit is of a Schmitt trigger type having a transfer characteristic with hysteresis. The input buffer circuit (12) is responsive to control signals received at its input for removing noise spikes around the threshold point of its input on both the rising and falling edges of the control signals so as to provide a pulsed output voltage. The filter circuit (14) is responsive to the pulsed output voltage for generating a filtered pulsed signal at an output terminal only when the pulsed output voltage has a pulse width which is longer than a predetermined time. The filter circuit includes a delay means (28), a gating means (30) and inverter means (32).

6 Claims, 2 Drawing Sheets

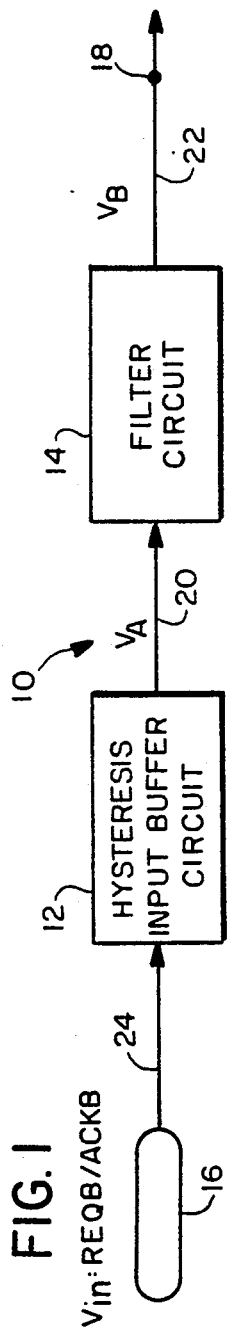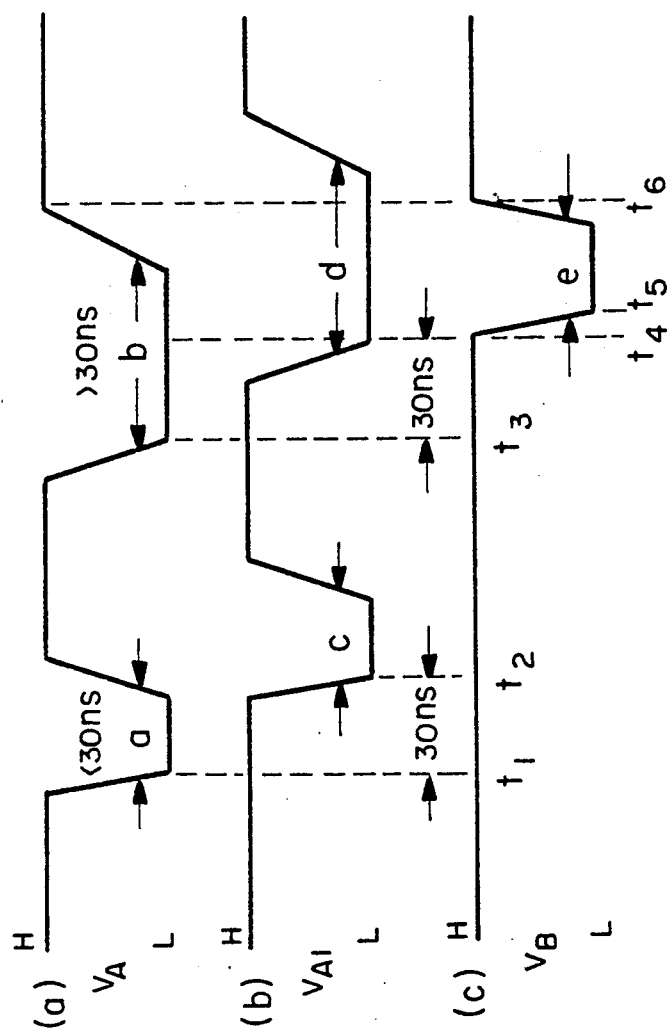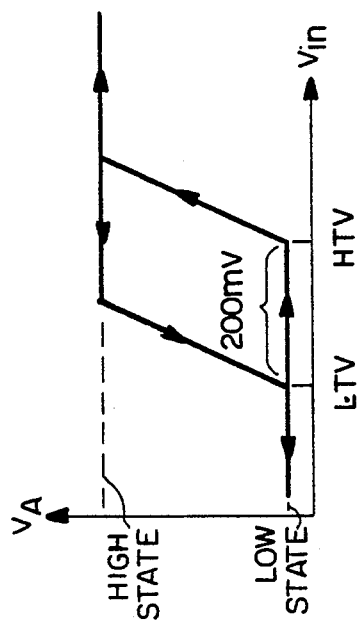

GLITCH REMOVER CIRCUIT FOR TRANSMISSION LINKS

BACKGROUND OF THE INVENTION

This invention relates generally to semiconductor integrated circuits and more particularly, it relates to a glitch remover circuit for removing glitches and spikes from control signals received on a SCSI (acronym for small computer system interface) bus line that is coupled from a transmission line.

As is generally well known, in order to provide smaller and faster devices in CMOS process technology the sizes of the devices used in the integrated semiconductor circuits have a reduced scaling or a shrinking of the geometries thereof. For example, the gate length of the devices, which have been around 1.6 microns, are further reduced to under 1 micron so as to achieve higher speeds of operation. In particular, when the effective length of the gate decreases the gate delay will be reduced so as to yield faster devices. However, the shrinking of the sizes of the integrated semiconductor devices to a smaller size than the heretofore generally acceptable standard size has not been done without any resulting problems. Such semiconductor devices of reduced dimensions fail generally from being more noise sensitive (i.e., lower noise immunity) and being not capable of providing reliable data transfer.

One application where noise immunity and reliable data transfer becomes important is in the field of data transmission on a fully loaded SCSI bus line which is coupled from a transmission line for communication with small computers. The basic problem encountered when transferring data on the SCSI bus line is due to noise and glitches which may cause double strobing of the data. The glitches are more hazardous when they appear on the REQB and ACKB lines. The control signals REQB and ACKB are used to perform a "handshake" so as to transfer the data back and forth between a target (i.e., disc drive) and an initiator (i.e., host computer). A glitch occurring in the control signal REQB can cause one or more extra bytes to be counted during long data transfers at the transfer rate of between 1.0-10 Mbytes/sec. On the other hand, the incorrect or wrong data could be transferred such as when an early control signal REQB occurs and the data signal lines are still being settled, thus causing the wrong data to be sampled. In another situation, the glitch present in the control signal REQB when the SCSI phase lines are being switched could result in a wrong phase.

Accordingly, there has arisen a need for some type of filtering devices which can remove the glitches and spikes occurring in the control signals REQB and ACKB on the SCSI bus line so as to provide reliable and accurate data transmission.

SUMMARY OF THE INVENTION

Accordingly, it is a general object of the present invention to provide a glitch remover circuit for removing glitches and spikes from control signals which is relatively simple and economical to manufacture and assemble.

It is an object of the present invention to provide a glitch remover circuit for removing glitches and spikes from control signals received on a SCSI bus line that is coupled from a transmission line.

It is another object of the present invention to provide a glitch remover circuit which includes a two-stage filter formed of an input buffer circuit and a filter circuit.

It is still another object of the present invention to provide a glitch remover circuit which includes an input buffer for removing noise spikes around the threshold point of its input both on the rising and falling edges of the control signal so as to provide a pulsed output voltage and a filter circuit responsive to the pulsed output voltage for generating a filtered pulsed signal only when the pulsed output voltage has a pulse width which is longer than a predetermined time.

In accordance with these aims and objectives, the present invention is concerned with the provision of a glitch remover circuit for removing glitches and spikes from control signals received on a SCSI bus line that is coupled from a transmission line. The glitch remover circuit includes an input buffer circuit and a filter circuit. The input buffer circuit is formed of a Schmitt trigger type and is responsive control signals received at its input for removing noise spikes around the threshold point of its input on both the rising and falling edges of the control signals so as to provide a pulsed output voltage. The filter circuit is responsive to the pulsed output voltage for generating a filtered pulsed signal at an output terminal only when the pulsed output voltage has a pulse width which is longer than a predetermined time. The filter circuit is formed of a delay circuit, a logic gate, and an inverter.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a block diagram of a glitch remover circuit, constructed in accordance with the principles of the present invention;

FIG. 3 is a waveform showing the transfer characteristics of the input buffer circuit; and FIGS. 4(a) through 4(c) are waveforms useful in understanding the operation of FIG. 2.

DESCRIPTION OF THE PREFERRED EMBODIMENT

Figure 2:
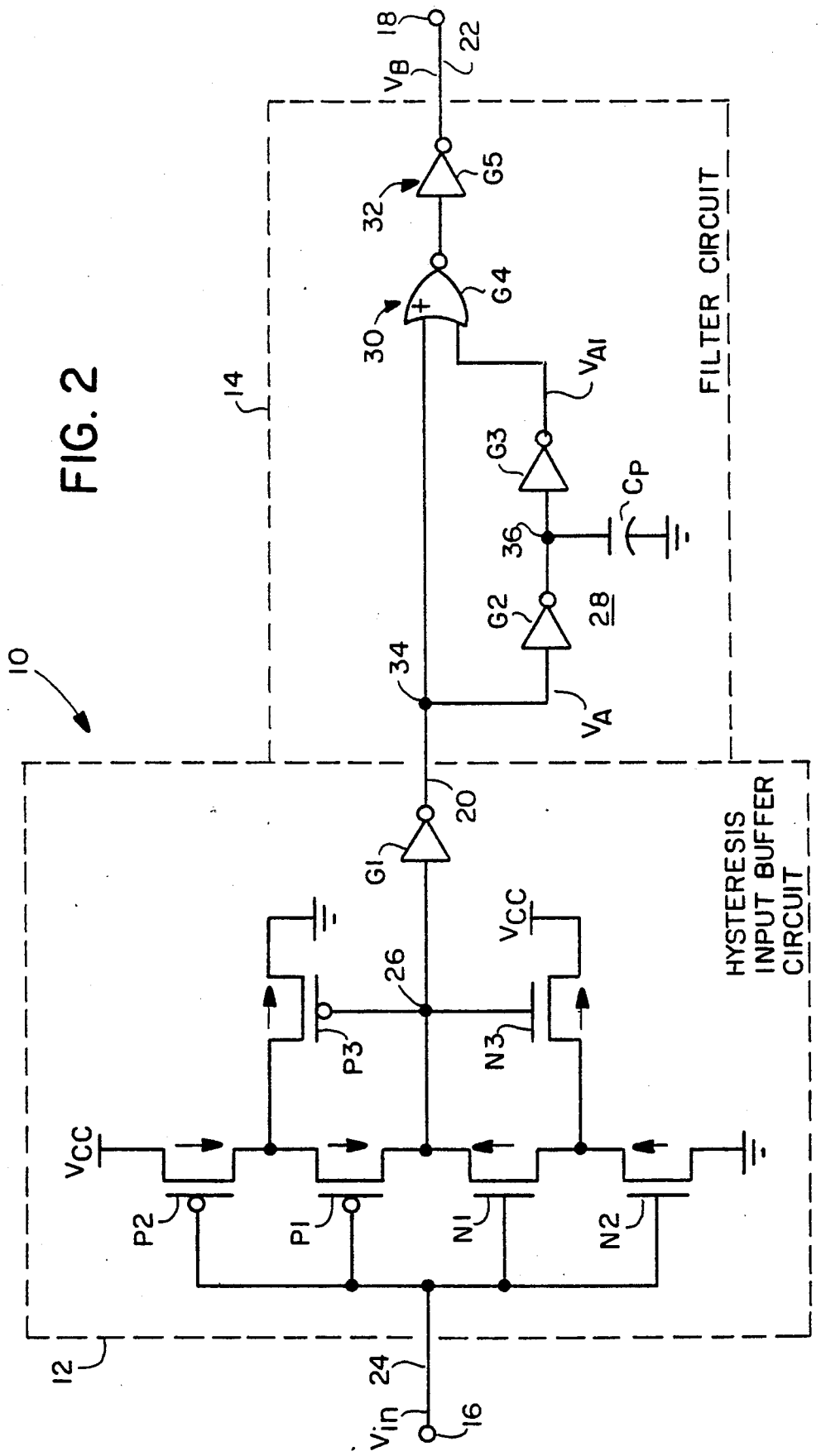
FIG. 2 is a detailed schematic diagram of the glitch remover circuit of FIG. 1.

Referring now in detail to the drawings, there is shown in FIG. 1 in block diagram form a glitch remover circuit 10 constructed in accordance with the principles of the present invention. The glitch remover circuit 10 is comprised of a two-stage filter which is preferably implemented in CMOS technology. The two-stage filter includes a first stage 12 and a second stage 14. The two-stage filter has an input terminal 16 for receiving input control signals REQB and ACKB ($V_{in}$) on a SCSI (small computer system interface) bus line that is coupled from a transmission line (not shown) and has an output terminal 18 for providing a filtered output signal $V_B$. As can be seen, the first stage 12 generates an output voltage $V_A$ on line 20 in response to the input control signals REQB and ACKB. The second stage 14 receives on its input the output voltage $V_A$ and generates the filtered output signal $V_B$ on line 22.

A detailed schematic diagram of preferred embodiment of the glitch remover circuit 10 of FIG. 1 is illustrated in FIG. 2. The first stage 12 is preferably comprised of an input buffer circuit of the CMOS Schmitt trigger type which has a transfer characteristic as depicted in FIG. 3. It will be noted that the Schmitt trigger type input buffer circuit has a first, higher trip voltage HTV, when reached by the input control signals $V_{in}$ on the line 24, causes its output voltage $V_A$ to change from its previously low state to a high state. When the input control signals $V_{in}$ on the line 24 drop to a second, lower trip voltage LTV the output voltage $V_A$ being in the high state will be changed back to the low state. The direction of travel of the input control signal $V_{in}$ from the second trip voltage to the first trip voltage and back to the second trip voltage is indicated by the arrows.

The present input buffer circuit 12 has been designed so that the minimum difference between the first trip voltage HTV and the second trip voltage LTV is 200 millivolts. As a result, oscillations that could occur due to the slow rising edges of the input control signals during a low-to-high transition (i.e., caused by charging of node and bus capacitances) will have been eliminated.

The Schmitt trigger type buffer circuit 12 includes a plurality of N-channel MOS transistors N1, N2 and N3; a plurality of P-channel MOS transistors P1, P2 and P3; and an inverter gate G1. The transistor N1 has its gate connected to the gate of the transistor P1 and has its drain connected to the drain of the transistor P1. The common gates of the transistors N1 and P1 defining the input of the input buffer circuit 12 is further joined to the input terminal 16 via the line 24 for receiving the input control signals $V_{in}$. The common drains of the transistors N1 and P1 are connected to the input of the inverter gate G1 at node 26. The output of the inverter gate G1 on the line 20 defines the output of the buffer circuit 12 and provides the output voltage $V_A$. The transistor N2 serving as a first load device has its drain connected to the source of the transistor N1, its gate connected to the gate of the transistor N1, and its source connected to a ground potential, which is typically at zero volts. The transistor N3 serving as a second load device has its drain connected to a supply potential VCC, which is typically at +5.0 volts, its gate connected to the node 26, and its source connected to the drain of the transistor N2.

The transistor P1 has its gate connected to the gate of the transistor P2 and has its source connected to the drain of the transistor P2. The transistor P2 serving as a third load device has its source connected to the supply potential VCC. The transistor P3 serving as a fourth load device has its source connected to the drain of the transistor P2, its gate connected to the node 26, and its drain connected to the ground potential.

A second stage 14 is formed of a delay portion 28, a gating device 30, and an inverting means 32. The delay portion 28 includes a first CMOS inverter gate G2 and a second CMOS inverter gate G3 which are connected in series. The inverter gate G2 has its input connected to an input node 34 which receives the output voltage $V_A$ on the line 20 from the output of the first stage 12. The input of the second inverter G3 is connected to the output of the first inverter gate G2 and to an internal node 36. A parasitic capacitance $C_p$ exists between the internal node 36 and the ground potential. The gating device 30 is comprised of a NOR logic gate G4 which has a first input connected to the input node 34 and a second input connected to the output of the second inverter gate G3. The inverting means 32 is comprised of an inverter gate G5 which has its input connected to the output of the NOR logic gate G4 and its output connected to the output terminal 18 via the line 22 for providing the filtered output signal $V_B$.

The CMOS inverter gate G2 is comprised of a P-channel MOS transistor and an N-channel MOS transistor whose gate dimensions thereof are ratioed to one another to obtain a first predetermined switchpoint. In order to obtain the desired switchpoint, the P-channel transistor has been intentionally designed with a small width-to-length ratio gate dimension so as to be a weak device, whereas the N-channel transistor has been fabricated with a gate region having a large width-to-length dimension ratio and is considered to be a strong device. As a result of the difference in relative strengths of the P-channel and N-channel transistors in the CMOS inverter gate G2, it will have a low trip point.

The CMOS inverter gate G3 is also comprised of a P-channel MOS transistor and an N-channel MOS transistor whose gate dimensions thereof are ratioed to one another to obtain a second predetermined switchpoint. In order to obtain the desired second switchpoint, the P-channel transistor has been specifically manufactured with a large width-to-length ratio gate dimension so as to be a strong device. On the other hand, the N-channel transistor has been fabricated with a gate region having a small width-to-length dimension ratio and is considered to be a weak device. Therefore, the inverter gate G3 thus formed has a high trip point.

When the input control signals $V_{in}$ having noise spikes are applied to the input terminal 16, the Schmitt trigger input buffer circuit 12 will remove any noise spikes around the threshold point of its input on both the rising and falling edges of the input control signals. This is achieved by the 200 mv hysteresis provided by the transistors N2, N3, P2 and P3 as is well known to those skilled in the art. Consequently, the output voltage $V_A$ at the output of the input buffer Circuit 12 will appear as illustrated in FIG. 4(a) of the drawings.

The sizes of the inverter gates G2 and G3 of the delay portion 28 of the second stage 14 have been chosen so as to introduce a delay of approximately 30 nanoseconds at nominal temperature and process. This delay is from the input of the first inverter gate G2 to the output of the second inverter gate G3, which affects the signal applied to the second input of the NOR logic gate G4. This delayed signal $V_{A1}$ on line 38 is the same as the input voltage $V_A$ but is delayed by approximately 30 ns and is shown in FIG. 4(b). The operation of the second stage 14 may be better understood by referring again to FIG. 4(a) which depicts a first pulse a having a width less than 30 ns and a second pulse b having a width greater than 30 ns. The pulse a represents a "glitch" in the control signals REQB and ACKB on the SCSI bus line and must not effect a pulsed signal to appear on the output terminal 18 which could cause a faulty situation. The pulse b represents a real signal and causes a filtered pulsed signal to be produced at the output terminal 18.

At the time t1, a first pulse a of the output signal $V_A$ will be switched from a high logic level to a low logic level. However, since the pulse c of the delay input signal $V_{A1}$ will be delayed by 30 ns and will not be switched from the high logic level to the low logic level until the time t2, the pulse a being shorter than 30 ns will have already returned back to the high logic level at the time t2. As a result, the output voltage $V_B$ at the output of the inverter gate G5, as illustrated in FIG. 4(c), will be unaffected and will remain in the high logic level. Thus, the pulse a representing a glitch will not cause a pulsed output signal.

At the time t3, the second pulse b of the output signal $V_A$ will be switched from the high logic level to the low logic level. The pulse b of the delayed output signal $V_{A1}$ will also be delayed 30 ns and will not be switched from the high logic level to the low logic level until the time t4. However, the pulse b being longer than 30 ns will still be in the low logic level at the time t4. Consequently, the output signal $V_B$ at the time t5 will be changed from the high logic level to the low logic level. Further, when the pulse b returns to the high logic level at time t6, the output voltage $V_B$ will be switched immediately back to the high logic level so as to form the filtered pulse signal e.

From the foregoing detailed description, it can thus be seen that the present invention provides a glitch remover circuit for removing glitches and spikes from control signals received on a SCSI bus line which is coupled from a transmission line. The present glitch remover circuit includes an input buffer circuit of a Schmitt trigger type and a filter circuit. The input buffer circuit is responsive to control signals for generating a pulsed output voltage. The filter circuit is responsive to the pulsed output voltage for generating a filtered pulsed signal at an output terminal only when the pulsed output voltage has a pulse width which is longer than a predetermined time.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A glitch remover circuit for removing glitches and spikes from control signals received on a SCSI bus line that is coupled from a transmission line, comprising:

input buffer means (12) being responsive to control signals received at its input fore removing noise spikes around the threshold point of its input on both the rising and falling edges of said control signals so as to provide a pulsed output voltage;

said input buffer means including a Schmitt trigger type circuit having a transfer characteristic with hysteresis;

said Schmitt trigger type circuit being formed of first through third N-channel MOS transistors (N1-N3), first through third P-channel MOS transistors (P1-P3), and an inverter gate (G1);

said first N-channel transistor (N1) having its gates connected to the gate of said first P-channel transistor (P2) and its drain connected to the drain of said first P-channel transistor (P1), said first N-channel and P-channel transistors having their gates connected together and to receive said control signals and having their drains connected together and to the input of said inverter gate (G1);

said second N-channel transistor (N2) having its drain connected to the source of said first N-channel transistor (N1), its gate connected to the gate of said first N-channel transistor (N1), and its source connected to a ground potential, said third N-channel transistor (N3) having its drain connected to a supply potential, its gate connected to the input of said inverter gate (G1), and its source connected to the drain of said second N-channel transistor (N2);

said first P-channel transistor (P1) having its gate connected to the gate of said second P-channel transistor (P2) and its source connected to the drain of said second P-channel transistor (P2);

said second P-channel transistor (P2) having its source connected to the supply potential, said third P-channel transistor (P3) having its source connected to the drain of said second P-channel transistor (P2), its gate connected to the input of said inverter gate (G1), and its drain connected to the ground potential, the output of said inverter gate (G1) providing the pulsed output voltage;

filtering means (14) responsive to said pulsed output voltage for generating a filtered pulsed signal at an output terminal only when said pulsed output voltage has a pulse width which is longer than a predetermined time; and said filtering means being formed of delay means (28), gating means (30) and inverter means (32).

2. A glitch remover circuit as claimed in claim 1, wherein said gating means (30) is comprised of a NOR logic gate (G4) having a first input, a second input, and an output, wherein said delay means (30) is comprised of a series connection of a first CMOS inverter gate (G2) and a second CMOS inverter gate (G3), and wherein said inverter means (32) is comprised of an inverter gate (G5).

3. A glitch remover circuit as claimed in claim 2, wherein said NOR logic gate (G4) has its first input connected to receive said pulsed output voltage and has its second input connected to receive said pulsed output voltage via said first and second inverters (G2, G3), and its output connected to the input of said inverter gate (G5), the output of said inverter gate (G5) providing said filtered pulsed signal.

4. A glitch remover circuit as claimed in claim 3, wherein said pulsed output voltage is delayed from the input of said first inverter gate (G2) to the output of said second inverter gate (G3) by approximately 30 ns.

5. A glitch remover circuit as claimed in claim 4, wherein said first CMOS inverter gate (G2) is comprised of a P-channel MOS transistor and an N-channel MOS transistor whose width-to-length gate dimensions thereof are ratioed to provide a low trip point.

6. A glitch remover circuit as claimed in claim 5, wherein said second CMOS inverter gate (G3) is comprised of a P-channel MOS transistor and an N-channel MOS transistor whose width-to-length gate dimensions thereof are ratioed to provide a high trip point.

* * * * *